United States Patent
Keller

(10) Patent No.: US 7,830,709 B2
(45) Date of Patent: Nov. 9, 2010

(54) INTEGRATED CIRCUIT, METHOD OF READING DATA STORED WITHIN A MEMORY DEVICE OF AN INTEGRATED CIRCUIT, METHOD OF WRITING DATA INTO A MEMORY DEVICE OF AN INTEGRATED CIRCUIT, MEMORY MODULE, AND COMPUTER PROGRAM

(75) Inventor: Jan Keller, Fontainebleau (FR)

(73) Assignees: Qimonda AG, Munich (DE); ALTIS Semiconductor, SNC, Corbeil Essonnes Cedex (FR)

( * ) Notice: Subject to any disclaimer, the term of this patent is extended or adjusted under 35 U.S.C. 154(b) by 717 days.

(21) Appl. No.: 11/709,289

(22) Filed: Feb. 21, 2007

(65) Prior Publication Data

US 2008/0198655 A1   Aug. 21, 2008

(51) Int. Cl.
*G11C 16/04* (2006.01)
(52) U.S. Cl. .................. 365/185.05; 365/230.03; 365/163; 365/230.04
(58) Field of Classification Search ............... 365/148, 365/158, 171, 185.05, 185.11, 230.03, 230.09, 365/214, 163, 173, 230.04
See application file for complete search history.

(56) References Cited

U.S. PATENT DOCUMENTS

| 6,754,124 | B2 | 6/2004 | Seyyedy et al. |
| 6,813,176 | B2 | 11/2004 | Gilton et al. |
| 7,215,568 | B2 * | 5/2007 | Liaw et al. ............... 365/148 |
| 7,379,328 | B2 * | 5/2008 | Osada et al. ............. 365/163 |
| 2006/0286709 | A1 | 12/2006 | Lung et al. |
| 2008/0079047 | A1 * | 4/2008 | Schmid ................. 257/296 |

FOREIGN PATENT DOCUMENTS

DE     10 2004 026 002 A1    12/2005

\* cited by examiner

*Primary Examiner*—Tuan T. Nguyen

(57) ABSTRACT

A memory device comprises a plurality of memory cells, each of which comprising a first electrode, a second electrode and an active material arranged between the first electrode and the second electrode, wherein the memory cells are grouped into memory cell groups, each memory cell group defining a memory cell group area and being configured such that corresponding first electrodes are individually addressable, and corresponding second electrodes are commonly addressable via a common select device provided within the memory cell group area of the memory cell group.

21 Claims, 10 Drawing Sheets

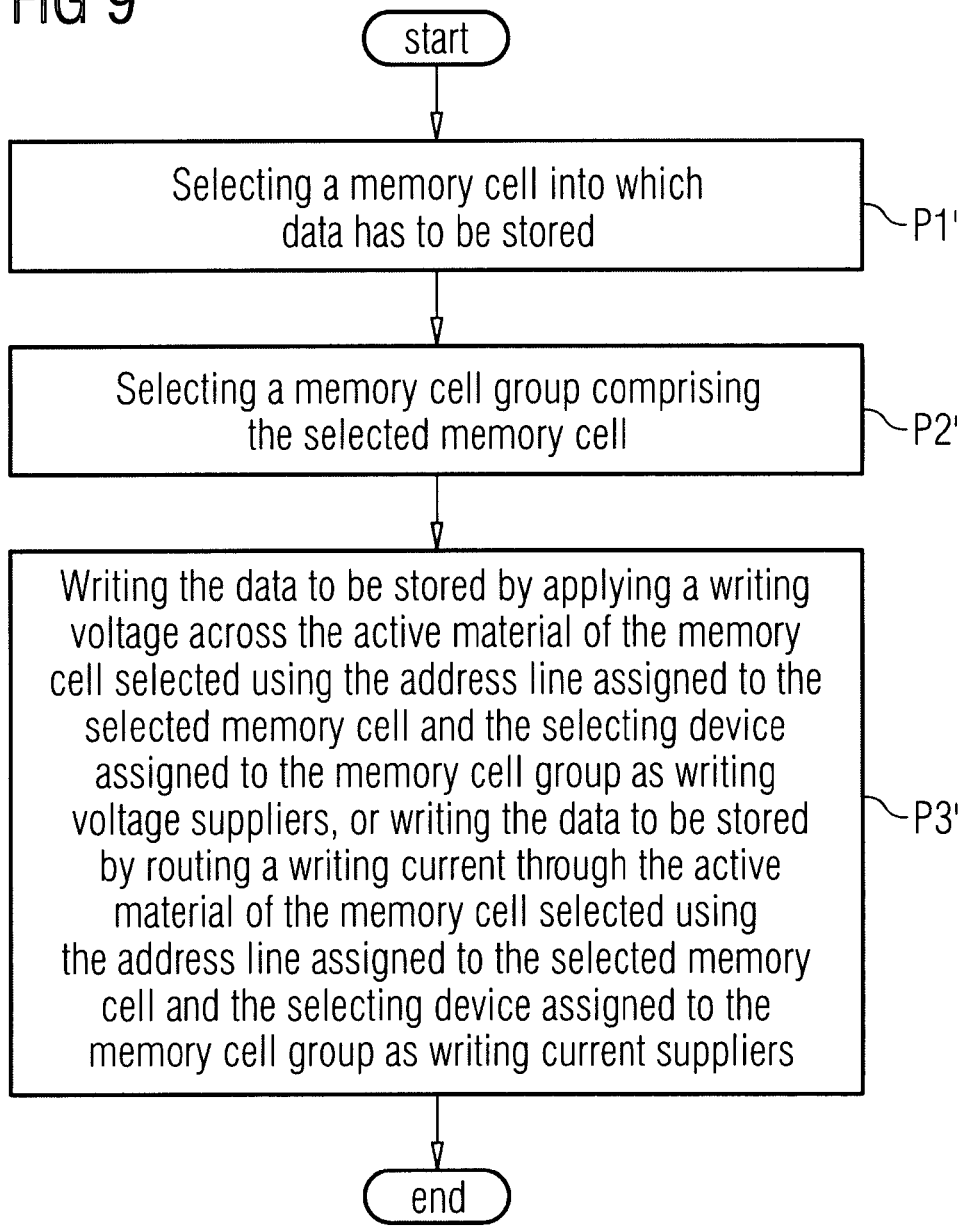

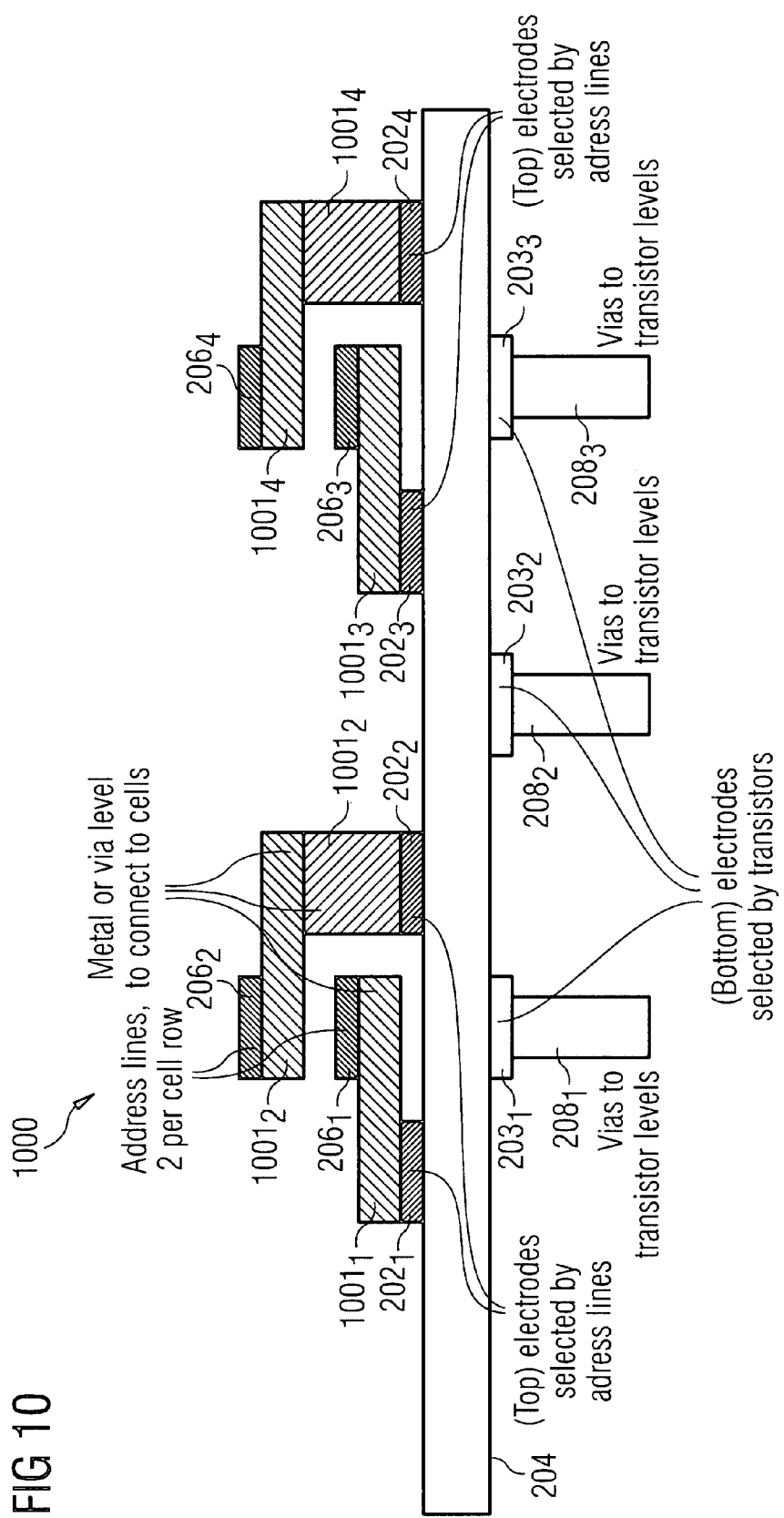

INTEGRATED CIRCUIT, METHOD OF READING DATA STORED WITHIN A MEMORY DEVICE OF AN INTEGRATED CIRCUIT, METHOD OF WRITING DATA INTO A MEMORY DEVICE OF AN INTEGRATED CIRCUIT, MEMORY MODULE, AND COMPUTER PROGRAM

BACKGROUND

The invention relates to an integrated circuit, a method of reading data stored within a memory device of an integrated circuit, a method of writing data into a memory device of an integrated circuit, a memory module, and a computer program.

SUMMARY OF THE INVENTION

According to one embodiment of the present invention, an integrated circuit including a memory device including a plurality of memory cells is provided, each of which having a first electrode, a second electrode and an active material arranged between the first electrode and the second electrode. The plurality of memory cells are grouped into memory cell groups. Each memory cell group defines a memory cell group area. The first electrodes of a memory cell group are individually addressable via respective address lines. The second electrodes of a memory cell group are commonly addressable via a common select device provided within the memory cell group area of the memory cell group.

BRIEF DESCRIPTION OF THE DRAWINGS

For a more complete understanding of exemplary embodiments of the present invention and the advantages thereof, reference is now made to the following description taken in conjunction with the accompanying drawings, in which:

FIG. 9 shows a flow chart of one embodiment of the method of writing data into a memory cell of the memory device according to the present invention;

FIG. 10 shows a schematic cross-sectional view of a part of one embodiment of the memory device according to the present invention;

DETAILED DESCRIPTION OF ILLUSTRATIVE EMBODIMENTS

Figure 1:
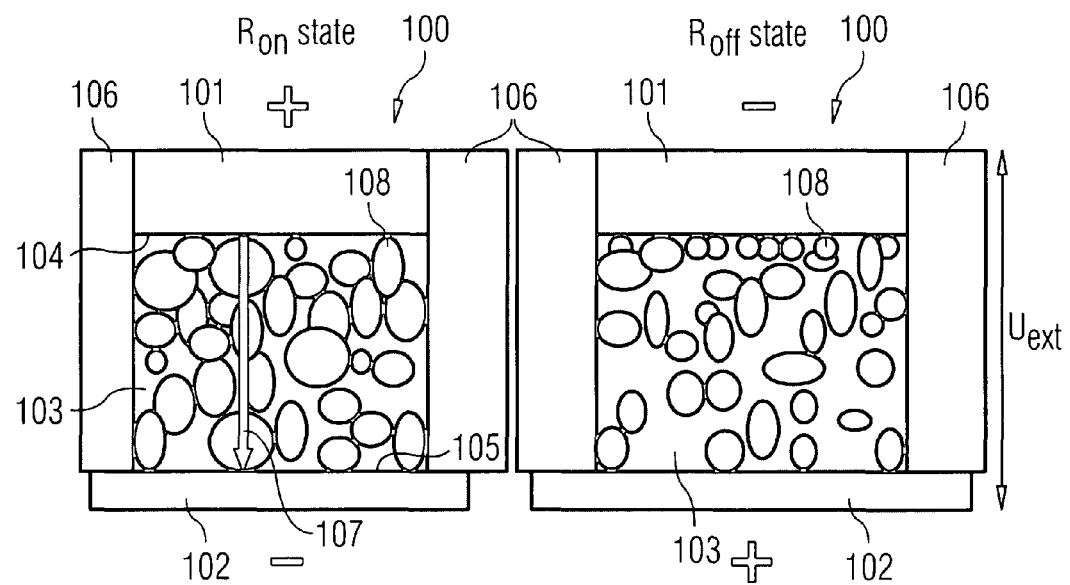
FIG. 1a shows a schematic cross-sectional view of a solid electrolyte random access memory cell set to a first memory state.
FIG. 1b shows a schematic cross-sectional view of a solid electrolyte random access memory cell set to a second memory state.

According to one embodiment of the present invention, an integrated circuit having a memory device including a plurality of memory cells is provided, each memory cell having a first electrode, a second electrode and an active material arranged between the first electrode and the second electrode. The plurality of memory cells is divided into memory cell groups. Each memory cell group defines a memory cell group area. The first electrodes of the memory cells of a memory cell group are individually addressable via respective address lines. The second electrodes of the memory cells of a memory cell group are commonly addressable via a common select device provided within the memory cell group area of the memory cell group.

According to this embodiment, the first electrodes of the memory cells of a memory cell group are electrically connected to an "own" address line, respectively, i.e., the address line being electrically connected to (the first electrode of) a particular memory cell is not electrically connected to other first electrodes of memory cells belonging to the same memory cell group. However, the address line may contact further first electrodes belonging to memory cells of other memory cell groups. In this way, it is ensured that each memory cell of the memory device can be uniquely addressed although the second electrodes of a memory cell group are simultaneously addressed via a corresponding common select device assigned to the memory cell group. If the memory cell groups overlap with each other, i.e., if memory cells assigned to a particular memory cell group are also assigned to further memory cell groups, several ways exist to uniquely address a particular memory cell.

One advantage of this embodiment is that, in order to increase the memory depth of the memory device, the spatial dimensions of the select devices of the memory device do not have to be scaled down. Since each common select device is shared by several memory cells, more space is available for each common select device (compared to select devices of memory devices in which each select device is coupled to only one memory cell).

The term "memory cell group area" means the region of the memory device which is occupied by the memory cells assigned to a memory cell group and/or the regions above and under the memory cells assigned to the memory cell group.

Generally, the number of second electrodes of each memory cell group can be chosen arbitrarily. For example, according to one embodiment of the present invention, each memory cell group is configured such that the corresponding memory cells of the memory cell group include only one common second electrode.

According to one embodiment of the present invention, each memory cell group is configured such that corresponding first electrodes are arranged around a common second electrode.

According to one embodiment of the present invention, each memory cell group is configured such that corresponding first electrodes are arranged around a common second electrode in a point-symmetrical manner.

According to one embodiment of the present invention, the arrangements of first electrodes around respective common second electrodes are arrangements having a rectangular shape or a hexagonal shape or a octagonal shape, the symmetry center of each shape being the respective common second electrode.

According to one embodiment of the present invention, the first electrodes are addressable via address lines, each first electrode of a memory cell group being electrically connected to an individual address line.

According to one embodiment of the present invention, the memory cells form a memory cell array comprising memory cell rows and memory cell columns, the address lines being arranged parallel to the memory cell rows.

According to one embodiment of the present invention, each address line is electrically connected to every second memory cell of a memory cell row.

According to one embodiment of the present invention, the lateral positions of the first electrodes differ from the lateral positions of the address lines to which the first electrodes are electrically connected.

According to one embodiment of the present invention, electrical connections are provided extending, in a direction parallel to the memory cell rows, from the address lines to the first electrodes, the electrical connections electrically connecting the address lines to the first electrodes.

According to one embodiment of the present invention, the address lines include first address lines and second address lines, the first address lines alternating with the second address lines, wherein the electrical connections connected to the first address lines extend in opposite direction compared to the electrical connections connected to the second address lines. The electrical connections connected to the first address lines may also extend in the same direction compared to the electrical connections connected to the second address lines.

According to one embodiment of the present invention, all memory cell groups show the same pattern of memory cells or the same pattern of first electrodes and second electrodes.

According to one embodiment of the present invention, the memory cells have a vertical architecture, respectively (i.e., a connection line between the first electrode and the second electrode of a memory cell substantially extends in a vertical direction).

According to one embodiment of the present invention, the memory cells have a lateral architecture, respectively (i.e., a connection line between the first electrode and the second electrode of a memory cell substantially extends in a lateral direction).

According to one embodiment of the present invention, each memory cell group includes four memory cells.

According to one embodiment of the present invention, the memory device is a non volatile memory device. According to one embodiment of the present invention, the memory device is a resistive memory device.

According to one embodiment of the present invention, the memory device is a solid electrolyte random access memory device, the active material being solid electrolyte material.

According to one embodiment of the present invention, the memory device is a phase changing random access memory device, the active material being phase changing material. The present invention is not restricted to these embodiments.

According to one embodiment of the present invention, the first electrodes are top electrodes, and the second electrodes are bottom electrodes (vertical memory cell architecture).

According to one embodiment of the present invention, a method of reading data stored within a memory device is provided. The memory device includes a plurality of memory cells, each of which having a first electrode, a second electrode and an active material arranged between the first electrode and the second electrode. The plurality of memory cells is grouped into memory cell groups. Each memory cell group defines a memory cell group area. The first electrodes of a memory cell group are individually addressable via respective address lines. The second electrodes of a memory cell group are commonly addressable via a common select device provided within the memory cell group area of the memory cell group. The method includes the following processes: selecting a memory cell from which data has to be read, selecting a memory cell group including the selected memory cell, and reading the data stored within the memory cell by routing a sensing current through (or applying a sensing voltage across) the selected memory cell via the address line assigned to the selected memory cell and the selecting device assigned to the memory cell group.

According to one embodiment of the present invention, a method of writing data into a memory device including a plurality of memory cells is provided, each memory cell having a first electrode, a second electrode and an active material arranged between the first electrode and the second electrode. The plurality of memory cells is grouped into memory cell groups. Each memory cell group defines a memory cell group area. The first electrodes of a memory cell group are individually addressable via respective address lines. The second electrodes of a memory cell group are commonly addressable via a common select device provided within the memory cell group area of the memory cell group. The method includes the following processes: Selecting a memory cell from which data has to be read, selecting a memory cell group including the selected memory cell, and writing the data to be stored by applying a writing voltage across the active material of the memory cell selected using the address line assigned to the selected memory cell and the selecting device assigned to the memory cell group as writing voltage suppliers, or writing the data to be stored by routing a writing current through the active material of the memory cell selected using the address line assigned to the selected memory cell and the selecting device assigned to the memory cell group as writing current suppliers.

All embodiments of the memory device according to the present invention discussed above may also be applied to the embodiments of the method of reading/writing data from/into a memory device according to the present invention.

According to one embodiment of the present invention, a computer program product is provided, configured to perform, when being carried out on a computing device or a digital signal processor, a method of reading data stored within a memory device including a plurality of memory cells, each of which including a first electrode, a second electrode and an active material arranged between the first electrode and the second electrode. The plurality of memory cells is grouped into memory cell groups. Each memory cell group defines a memory cell group area. The first electrodes of a memory cell group are individually addressable via respective address lines, and the second electrodes of a memory cell group are commonly addressable via a common select device located within the memory cell group area of the memory cell group. The method includes the following processes: selecting a memory cell from which data has to be read, selecting a memory cell group including the selected memory cell, and reading the data stored within the memory cell by routing a sensing current through (or applying a sensing voltage across) the selected memory cell via the address line assigned to the selected memory cell and the selecting device assigned to the memory cell group.

According to an embodiment of the present invention, a computer program product is provided adapted to perform, when being carried out on a computing device or a digital signal processor, a method of writing data into a memory device including a plurality of memory cells, each of which including a first electrode, a second electrode and an active material arranged between the first electrode and the second electrode. The plurality of memory cells are divided into memory cell groups, each of which define a memory cell group area. The first electrodes of a memory cell group are individually addressable via respective address lines, and the second electrodes of a memory cell group are commonly addressable via a common select device located within the memory cell group area of the memory cell group. The method includes the following processes: selecting a memory cell into which data has to be stored, selecting a memory cell group including the selected memory cell, and writing the data to be stored by applying a writing voltage across (or writing current through) the active material of the memory cell selected using the address line assigned to the selected memory cell and the selecting device assigned to the memory cell group as writing voltage (writing current) suppliers.

According to one embodiment of the present invention, a data carrier adapted to store computer program product as discussed above is provided.

According to an embodiment of the present invention, a memory module comprising at least one integrated circuit according to the present invention is provided. According to an embodiment of the present invention, the memory module is stackable.

As already mentioned, the memory device may be a phase changing random access memory device (PCRAM) or a solid electrolyte random access memory device. Since the embodiments of the present invention can be in particular applied to CBRAM (Conductive Bridging Random Access Memory, also referred to as solid electrolyte random access memory) devices, in the following description, making reference to FIGS. 1a and 1b, a basic principle underlying CBRAM devices will be explained.

As shown in FIG. 1a, a CBRAM cell includes a first electrode 101 a second electrode 102, and an solid electrolyte block (in the following also referred to as ion conductor block) 103 sandwiched between the first electrode 101 and the second electrode 102. The first electrode 101 contacts a first surface 104 of the ion conductor block 103, the second electrode 102 contacts a second surface 105 of the ion conductor block 103. The ion conductor block 103 is isolated against its environment by an isolation structure 106. The first surface 104 usually is the top surface, the second surface 105 the bottom surface of the ion conductor 103. In the same way, the first electrode 101 generally is the top electrode, and the second electrode 102 the bottom electrode of the CBRAM cell. One of the first electrode 101 and the second electrode 102 is a reactive electrode, the other one an inert electrode. Here, the first electrode 101 is the reactive electrode, and the second electrode 102 is the inert electrode. In this example, the first electrode 101 includes silver (Ag), the ion conductor block 103 includes silver-doped chalcogenide material, and the isolation structure 106 includes $SiO_2$.

If a voltage as indicated in FIG. 1a is applied across the ion conductor block 103, a redox reaction is initiated which drives $Ag^+$ ions out of the first electrode 101 into the ion conductor block 103 where they are reduced to Ag, thereby forming Ag rich clusters within the ion conductor block 103.

If the voltage applied across the ion conductor block 103 is applied for a long period of time, the size and the number of Ag rich clusters within the ion conductor block 103 is increased to such an extent that a conductive bridge 107 between the first electrode 101 and the second electrode 102 is formed. In case that a voltage is applied across the ion conductor 103 as shown in FIG. 1b (inverse voltage compared to the voltage applied in FIG. 1), a redox reaction is initiated which drives $Ag^+$ ions out of the ion conductor block 103 into the first electrode 101 where they are reduced to Ag. As a consequence, the size and the number of Ag rich clusters within the ion conductor block 103 is reduced, thereby erasing the conductive bridge 107.

In order to determine the current memory status of a CBRAM cell, a sensing current is routed through the CBRAM cell. The sensing current experiences a high resistance in case no conductive bridge 107 exists within the CBRAM cell, and experiences a low resistance in case a conductive bridge 107 exists within the CBRAM cell. A high resistance may for example represent "0", whereas a low resistance represents "1", or vice versa.

Figure 2:
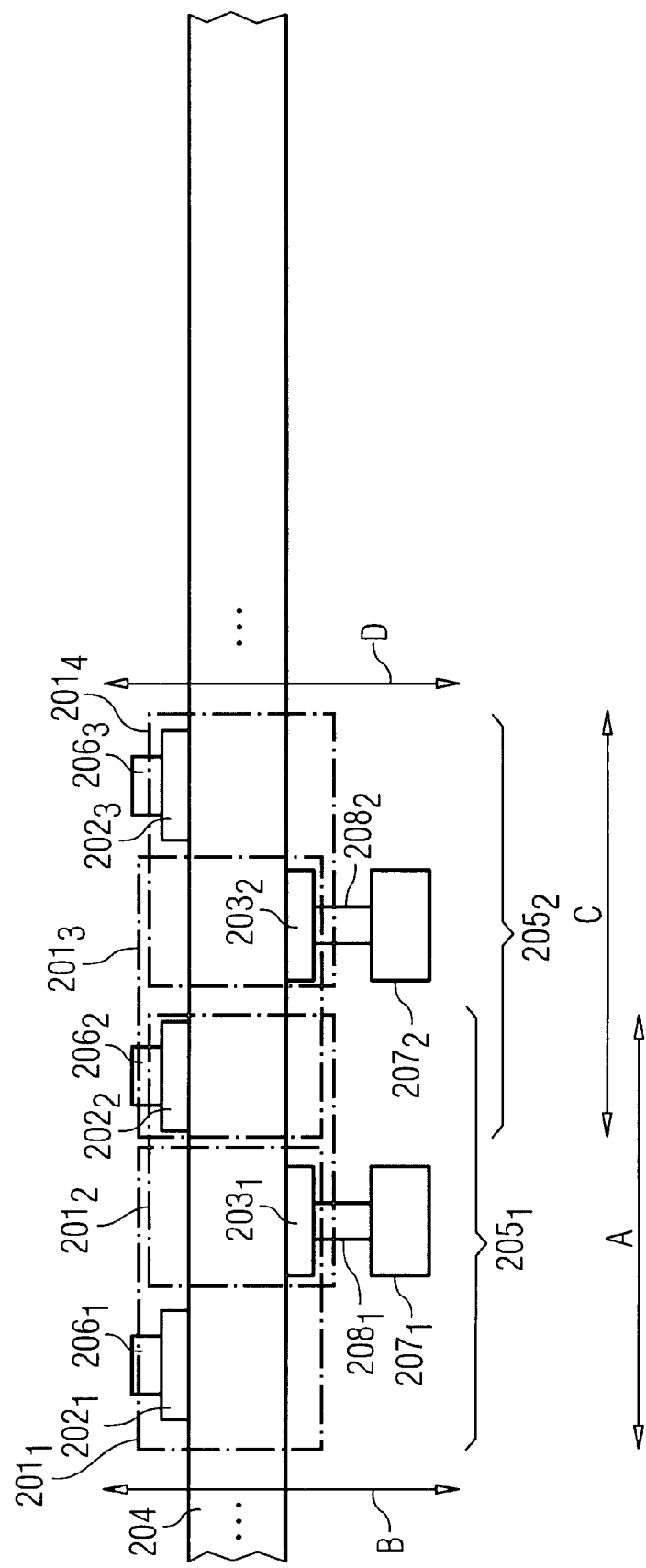
FIG. 2 shows a schematic cross-sectional view of a part of one embodiment of a memory device according to the present invention.

FIG. 2 shows an embodiment 200 of the memory device according to the present invention. The embodiment 200 includes a plurality of memory cells 201, each memory cell 201 including a first electrode 202, a second electrode 203 and a part of an active material 204 layer arranged between the first electrode 202 and the second electrode 203. The plurality of memory cells 201 is divided into memory cell groups 205. Here, a first memory cell group $205_1$ includes a first memory cell $201_1$ and a second memory cell $201_2$, and a second memory cell group $205_2$ includes a third memory cell $201_3$ and a fourth memory cell $201_4$. A first memory cell group area defined by the memory cells of the first memory cell group $205_1$ is indicated by the arrows A and B, whereas a second memory cell group area defined by the memory cells of the second memory cell group $205_2$ is indicated by the arrows C and D. The first memory cell $201_1$ includes a first top electrode $202_1$ and a first common bottom electrode $203_1$. The second memory cell $201_2$ includes the first common bottom electrode $203_1$ and a second top electrode $202_2$. The third memory cell $201_3$ includes the second top electrode $202_2$ and a second common bottom electrode $203_2$. The fourth memory cell $201_4$ includes the second common bottom electrode $203_2$ and a third top electrode $202_3$. Each of the first to fourth memory cells $201_1$ to $201_4$ includes a part of the active material 204 layer lying between the respective top electrode 202 and the respective bottom electrode 203. The first memory cell group $205_1$ overlaps with the second memory cell group $205_2$, i.e., the second top electrode $202_2$ is shared by the first memory cell group $205_1$ and the second memory cell group $205_2$. Each top electrode 202 of a memory cell group 205 is individually addressable via an address line 206. For example, the first top electrode $202_1$ is individually addressable using a first address line $206_1$, the second top electrode $202_2$ is individually addressable by a second address line $206_2$, and the third top electrode $202_3$ is individually addressable using a third address line $206_3$. The first memory cell $201_1$ and the second memory cell $201_2$ of the first memory cell group $205_1$ share a common bottom electrode 203, namely the first common bottom electrode $203_1$. The first common bottom electrode $203_1$ is addressable via a first common select device $207_1$ being electrically connected to the first common bottom electrode $203_1$ via a first electrical connection $208_1$. The third memory cell $201_3$ and the fourth memory cell $201_4$ share a common bottom electrode 203, namely the second common bottom electrode $203_2$. The second common bottom electrode $203_2$ is electrically connected to a second common select device $207_2$ via a second electrical connection $208_2$.

In order to address for example the first memory cell $201_1$, the first top electrode $202_1$ and the first common bottom electrode $203_1$ are selected using the first address line $206_1$ and the first common select device $207_1$. In order to address, for example, the second memory cell $201_2$, the second top electrode $202_2$ and the first common bottom electrode $203_1$ are selected using the second address line $206_2$ and the first common select device $207_1$. In order to address the third memory cell $201_3$, the second top electrode $202_2$ and the second common bottom electrode $203_2$ are selected using the second address line $206_2$ and the second common select device $207_2$. In order to address the fourth memory cell $201_4$, the third top electrode $202_3$ and the second common bottom electrode $203_2$ are selected using the third address line $206_3$ and the second common select device $207_2$.

Since only one select device 207 is used for each memory cell group 205, the spatial dimensions of the select devices 207 are not limiting when scaling down the dimensions of the memory device. Thus, high memory densities can be achieved without scaling down the physical dimensions of the select devices 207.

Figure 3:
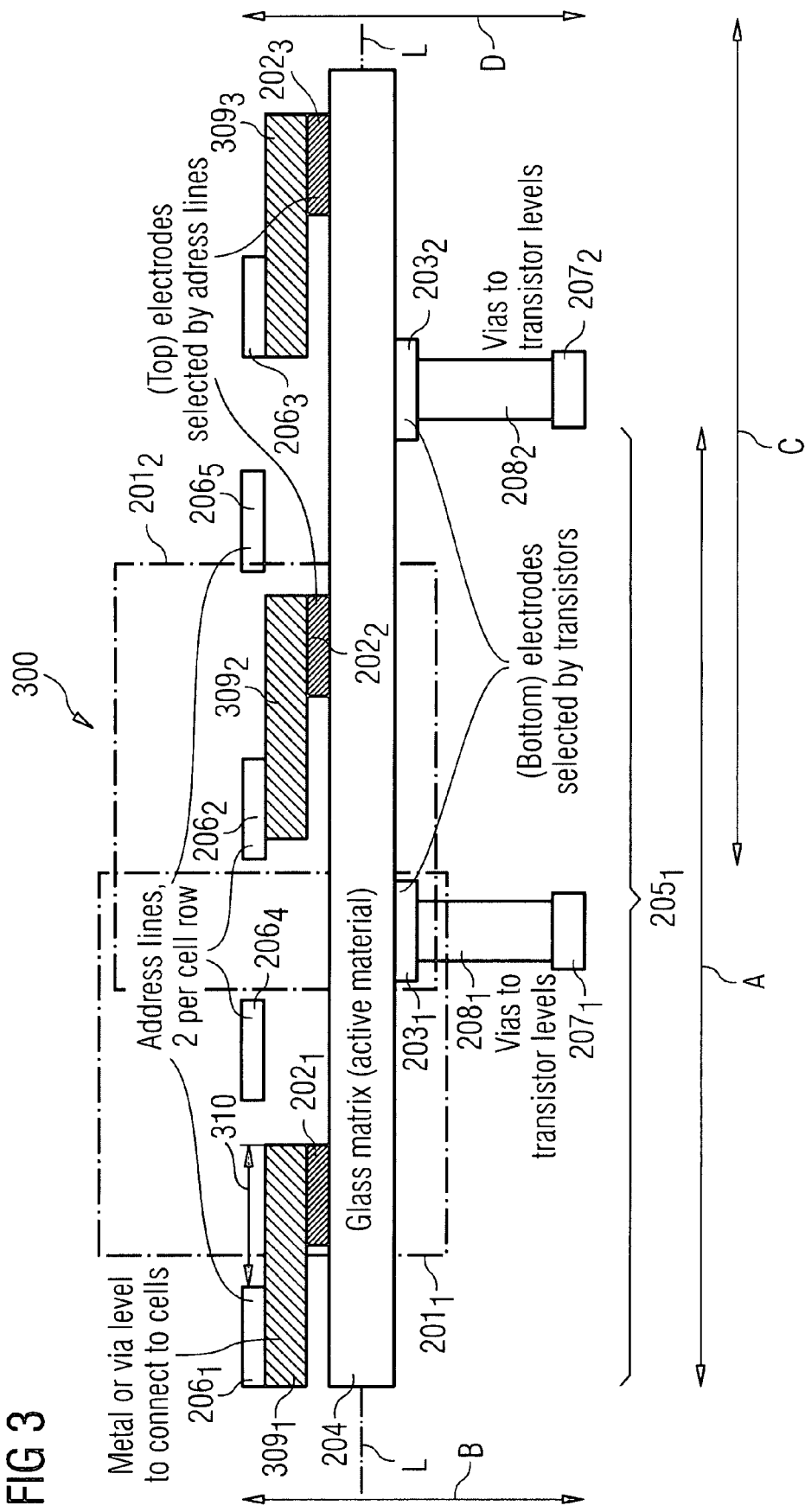
FIG. 3 shows a schematic cross-sectional view of a part of one embodiment of the memory device according to the present invention.
Figure 4:
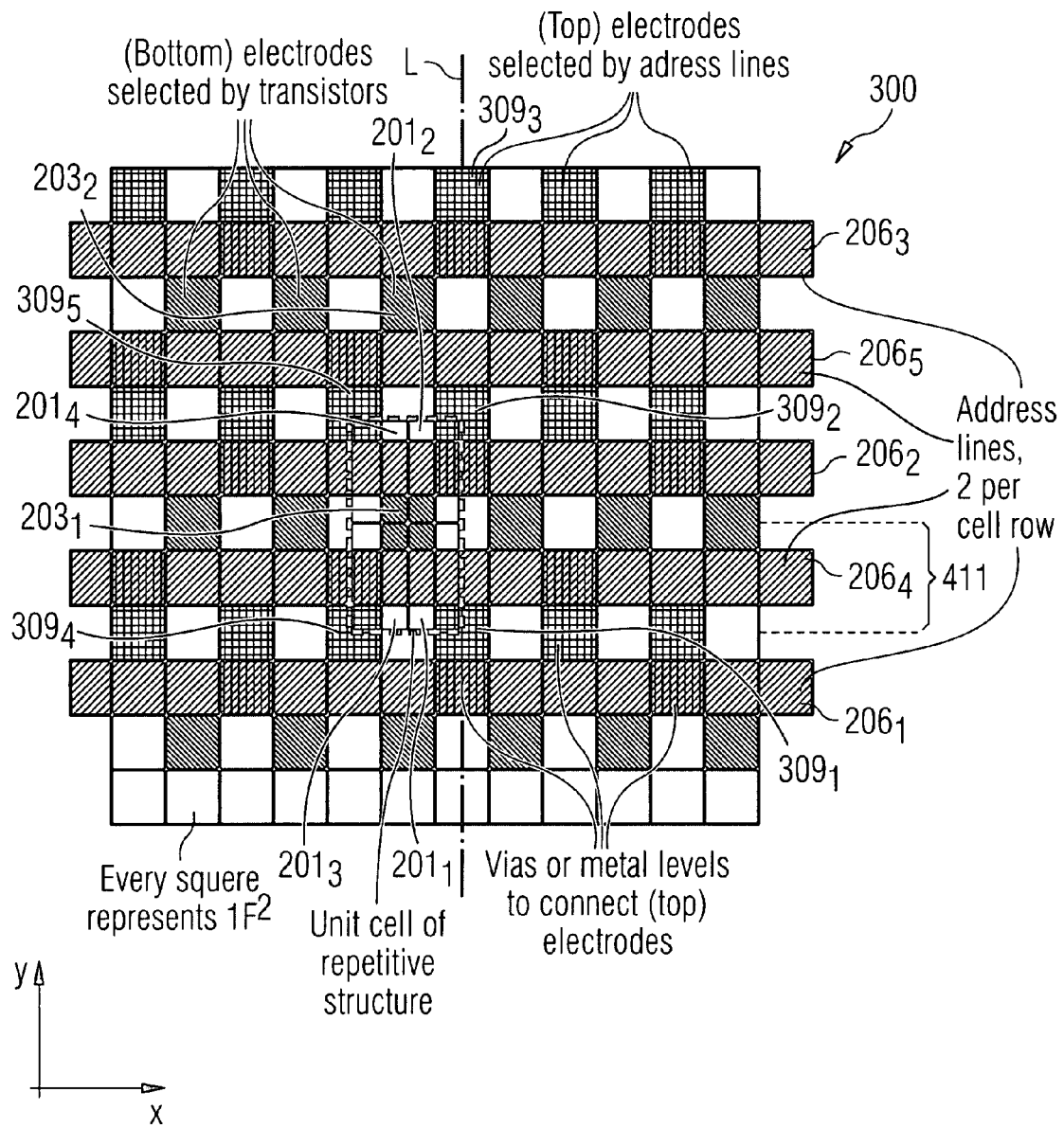
FIG. 4 shows a schematic top view of a part of one embodiment of a memory device according to the present invention.

FIGS. 3 and 4 show a further embodiment 300 of the memory device according to the present invention. As shown in FIG. 3, the memory device 300 has an architecture being very similar to the architecture of the memory device 200 shown in FIG. 2. However, in this embodiment, the address lines 206 do not directly contact the first electrode 202 since the lateral positions of the first electrodes 202 differ from the lateral positions of the address lines 206 to which the first electrodes 202 are electrically connected, as exemplary indicated by arrow 310 in FIG. 3. Instead, each first electrode 202 is electrically connected to its individual address line 206 by an electrical connection 309 which may, for example, be a via or a part of a metal level layer. Here, the first top electrode $202_1$ is connected to the first address line $206_1$ via the first electrical connection $309_1$. The second top electrode $202_2$ is connected to the second address line $206_2$ via a second electrical connection $309_2$. The third top electrode $202_3$ is electrically connected to the third address line $206_3$ via a third electrical connection $309_3$.

The memory cell group 205 of the memory device 300 shown in FIGS. 3 and 4 includes four memory cells 201, respectively. Each first electrode 202 of a memory cell group 205 is connected to a different address line 206. For example, the first memory cell group $205_1$ shown in FIG. 3 includes a first address line $206_1$, a second address line $206_2$, a fourth address line $206_4$, and a fifth address line $206_5$. In FIG. 3, only two memory cells 201 of the first memory cell group $205_1$ are shown, namely the first memory cell $201_1$ and the second memory cell $201_2$. The first memory cell $201_1$ is electrically connected to the first address line $206_1$, whereas the second memory cell $201_2$ is electrically connected to the second address line $206_2$. The third memory cell $201_3$ (not shown, see FIG. 4) is electrically connected to the fourth address line $206_4$, and the fourth memory cell $201_4$ (not shown, see FIG. 4) is electrically connected to the fifth address line $206_5$.

As shown in FIG. 4, the first to fourth memory cells $201_1$ to $201_4$ of the first memory cell group $205_1$ form as a whole an arrangement having a rectangular shape, the symmetry center of the arrangement being the first bottom electrode $203_1$ (the common electrode of the first memory cell group $205_1$). The same applies to the arrangement formed by the first to fourth top electrode $202_1$ to $202_4$. As can be derived from FIG. 4, the first memory cell $201_1$ is electrically connected to the first address line $206_1$ via the first electrical connection $309_1$, the second memory cell $201_2$ is electrically connected to the second address line $206_2$ via the second electrical connection $309_2$, the third memory cell $201_3$ is electrically connected to the fourth address line $206_4$ via a fourth electrical connection $309_4$, and the fourth memory cell $201_4$ is electrically connected to the fifth address line $206_5$ via a fifth electrical connection $309_5$.

Thus, four different address lines, namely the first, second, forth, and fifth address lines $206_1$, $206_2$, $206_4$, $206_5$ are used (together with the first common bottom electrode $203_1$ connected to a first common select device $207_1$) to select the first to fourth memory cell $201_1$ to $201_4$.

As can be derived from FIGS. 3 and 4, each address line 206 is electrically connected to every second memory cell 201 of a memory cell row 411 (top electrode row). The lateral positions of the first electrodes 202 differ from the lateral positions of the address lines 206 to which the first electrodes 202 are electrically connected. For example, the lateral position of the first top electrode $202_1$ differs from the lateral position of the first address line $206_1$ (different position regarding a Y-direction) to which the first top electrode $202_1$ is electrically connected. The electrical connections 309 of two neighboring address lines extend in opposite direction with respect to each other. For example, all electrical connections 309 being electrically connected to the first address line $206_1$ (which is the neighboring address line of the fourth address line $206_4$) extend in positive Y-direction, whereas all electrical connections 309 electrically connected with the fourth address line $206_4$ extend in negative Y-direction.

The memory cell shown in FIGS. 3 and 4 may be a non-volatile memory device, for example a solid electrolyte random access memory device. In this case, the active material 204 may for example comprise chalcogenide material (solid electrolyte material), the first electrodes 202 may comprise reactive material, and the second electrodes 203 may comprise inert material. A further example of a non-volatile memory device is a phase changing random access memory device (PCRAM). In this case, the active material is a phase changing material.

Figure 5:
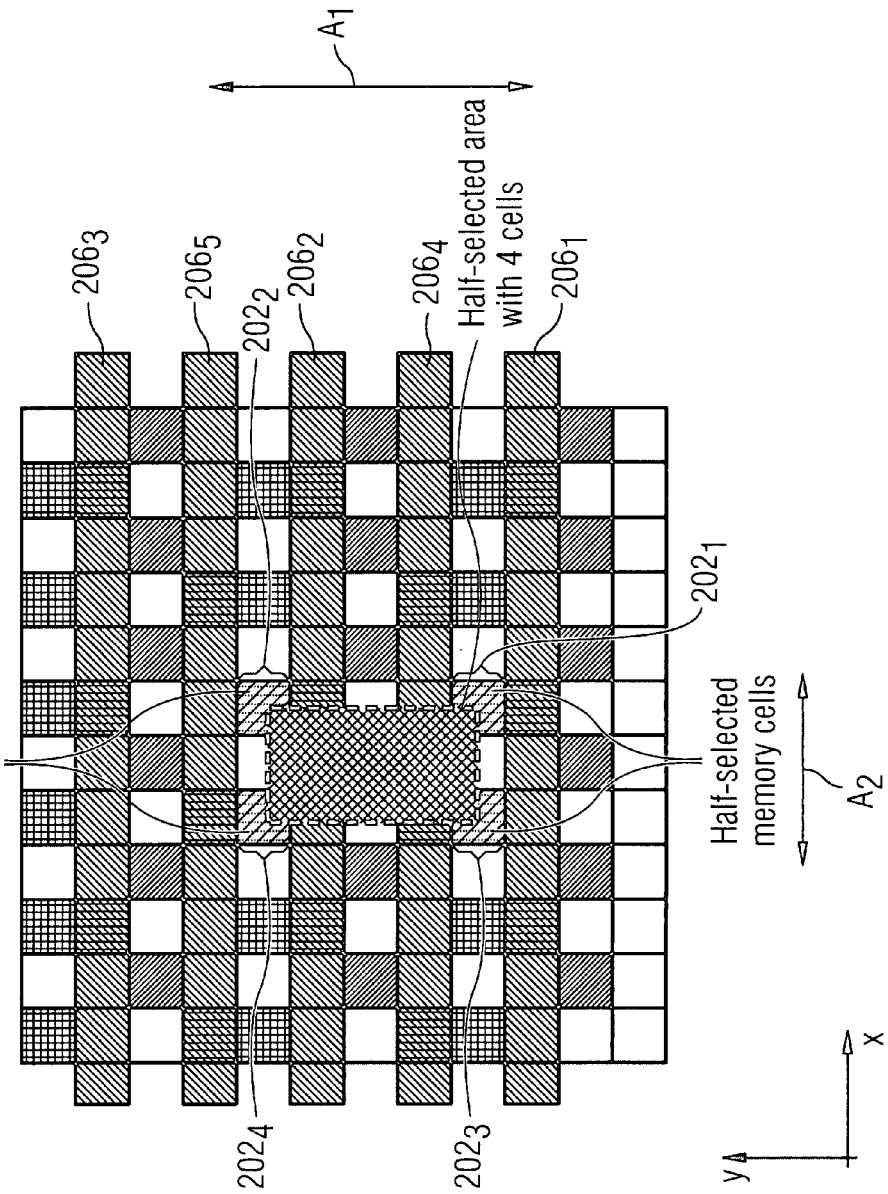
FIG. 5 shows a schematic top view of a process when selecting a memory cell of the memory device shown in FIGS. 2, 3 and 4.

In FIG. 4, only one memory cell group (first memory cell group $205_1$) is denoted by reference signs. All other memory cell groups not being denoted by reference signs have the same structure. Thus, the memory device 300 can be interpreted as a concatenation of a plurality of identical memory cell groups 205. In FIG. 4, the repeating pattern of the memory cell groups (here: the repeating pattern of the first memory cell group $205_1$) is indicated by dotted lines. FIG. 5 shows that the first bottom electrode $203_1$ belonging to the first memory cell group $205_1$ half selects an area indicated by reference numeral 500.

In order to further increase the memory density of the memory device 300, it is possible to stack at least some of the address lines 206 above each other. An example 1000 of such an embodiment is shown in FIG. 10.

The architecture of the memory device 1000 corresponds to the architecture of the memory device 300 shown in FIG. 3 up to the level of the top electrodes 202 (here, a first to fourth top electrode $202_1$ to $202_4$ are shown). The top electrodes 202 being part of the row of top electrodes also including the first top electrode $202_1$ are alternately contacted by the first bit line $206_1$ and the second bit line $206_2$ (along a direction corresponding to the direction of the bit lines 206), wherein the first bit line $206_1$ and the second bit line $206_2$ are stacked above each other. In the same way, the top electrodes 202 being part of the row of top electrodes also including the second top electrode $202_2$ are alternately contacted by the first bit line $206_1$ and the second bit line $206_2$ (along a direction corresponding to the direction of the bit lines 206). The same holds true for the third top electrode $202_3$, the fourth top electrode $202_4$, the third bit line $206_3$, and the fourth bit line $206_4$. In the cross-sectional view shown in FIG. 10, the first bit line $206_1$ is connected to the first top electrode $202_1$ via a first electrical connection $1001_1$ (metal or via connection), the second bit line $206_2$ is connected to the second top electrode $202_2$ via a second electrical connection $1001_2$ (metal or via connection), the third bit line $206_3$ is connected to the third top electrode $202_3$ via a third electrical connection $1001_3$ (metal or via connection), and the fourth bit line $206_4$ is connected to the fourth top electrode $202_4$ via a fourth electrical connection $1001_4$ (metal or via connection). In this way, the memory density of the memory device 1000 can be increased, compared to the memory device 300. In this way, two neighbouring bit lines 206 between which a row of bottom electrodes 203 is arranged (horizontal positions of the neighbouring bit lines 206 and the row of bottom electrodes 203 are different, respectively) are "condensed" into a "doubled" bit line 206 being arranged above the row of bottom electrodes 203 (horizontal positions of the parts of the doubled bit line 206 and the row of bottom electrodes 203 are the same).

Figure 6:
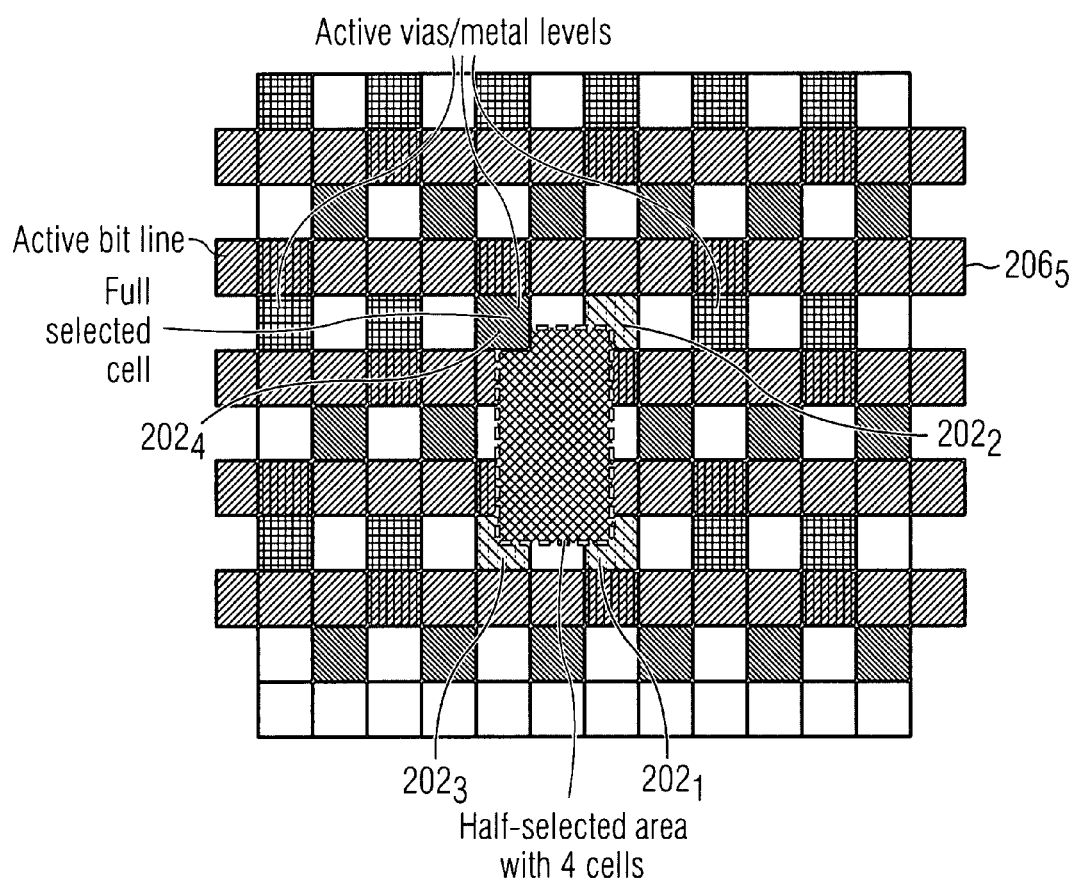
FIG. 6 shows a schematic top view of a process when selecting a memory cell of the memory device shown in FIGS. 2, 3 and 4.

FIG. 5 shows a first process when selecting a memory cell 201 of the memory device 300. Here, it is assumed that the fourth memory cell $201_4$ is selected. In order to select the fourth memory cell $201_4$, a memory cell group including the fourth memory cell $201_4$ is selected, for example, the first memory cell group $205_1$. The first memory cell group area is indicated by the arrows $A_1$ and $A_2$. Then, the corresponding first common select device $207_1$ is used to half-select all memory cells 201 of the memory cell group 205, i.e., to half-select the first to fourth memory cell $201_1$ to $201_4$. Then, in a second process, the address line 206 electrically connected to the selected memory cell 201 is selected, i.e., in this example the fifth address line $206_5$. In this way, the fourth memory cell $201_4$ is full-selected (see FIG. 6). The order of the processes may also be changed.

Figure 7:
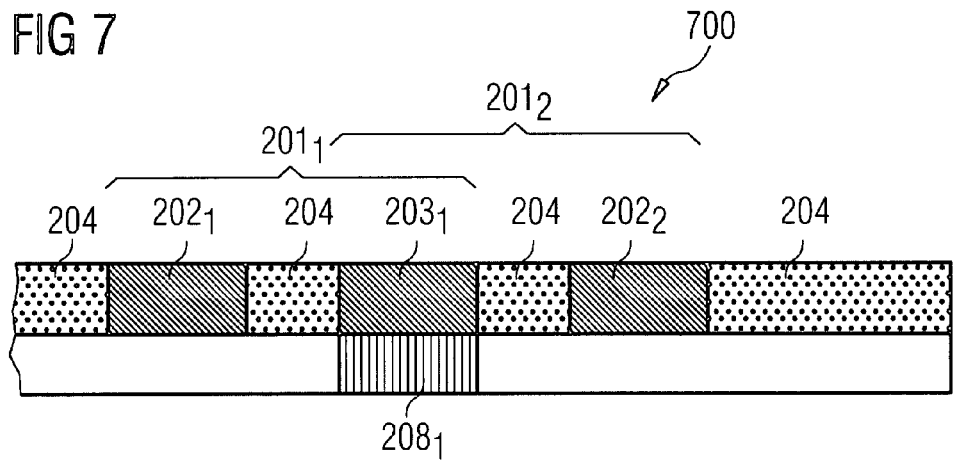
FIG. 7 shows a schematic cross-sectional view of a part of one embodiment of the memory device according to the present invention.

FIG. 7 shows an embodiment 700 of the memory device according to the present invention in which the memory cells 201 have a lateral architecture, whereas in the memory devices 200, 300, and 1000 the memory cells 201 have a vertical architecture. "Lateral architecture" means that the first electrode 202, the active material 204 and the second electrode 203 of a memory cell 201 form a lateral structure (memory device 700) whereas "vertical architecture" means that the same components form a vertical structure. All embodiments of the memory device according to the present invention having a vertical architecture may also be applied in an analog manner to the memory device having a lateral architecture.

Figure 8:
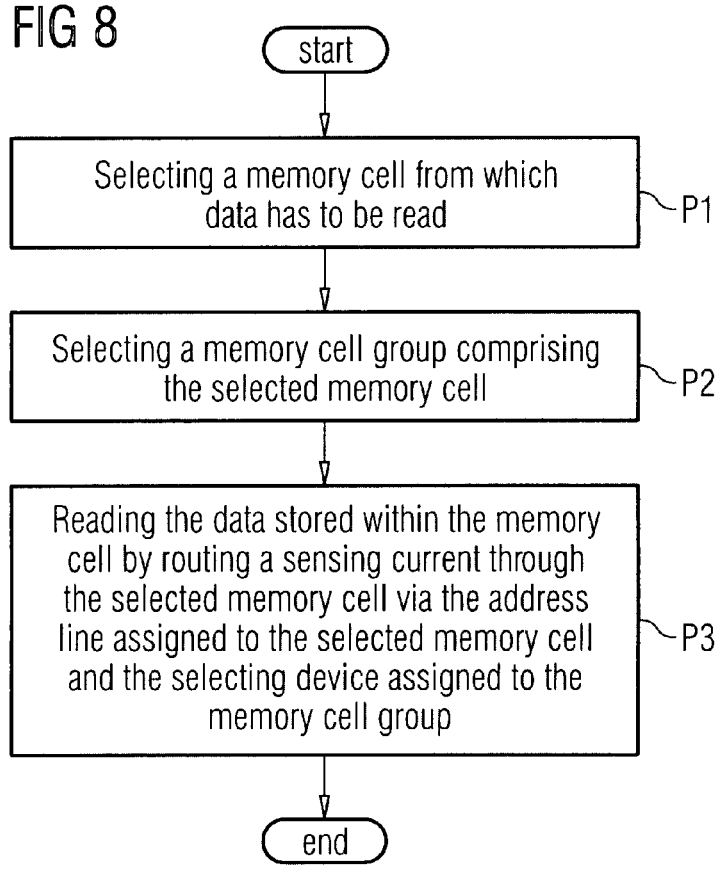
FIG. 8 shows a flow chart of one embodiment of the method of reading data from a memory cell of the memory device according to the present invention.

FIG. 8 shows one embodiment of the method of reading data from a memory cell of the memory device according to the present invention. In a first process P1, a memory cell is selected from which data has to be read. In a second process P2, a memory cell group comprising the selected memory cell is selected. In a third process P3, the data stored within the memory cell is read by routing a sensing current through the selected memory cell via the address line assigned to the selected memory cell and the selecting device assigned to the memory cell group.

FIG. 9 shows one embodiment of the method of writing data into a memory cell of the memory device according to the present invention. In a first process P1', a memory cell is selected into which data has to be written (stored). In a second process P2', a memory cell group comprising the selected memory cell is selected. In a third process P3', the data to be stored is written by applying a writing voltage across the active material of the memory cell selected using the address line assigned to the selected memory cell and the selecting device assigned to the memory cell group as writing voltage suppliers, or the data to be stored is written by routing a writing current through the active material of the memory cell selected using the address line assigned to the selected memory cell and the selecting device assigned to the memory cell group as writing current suppliers.

Figure 11A:
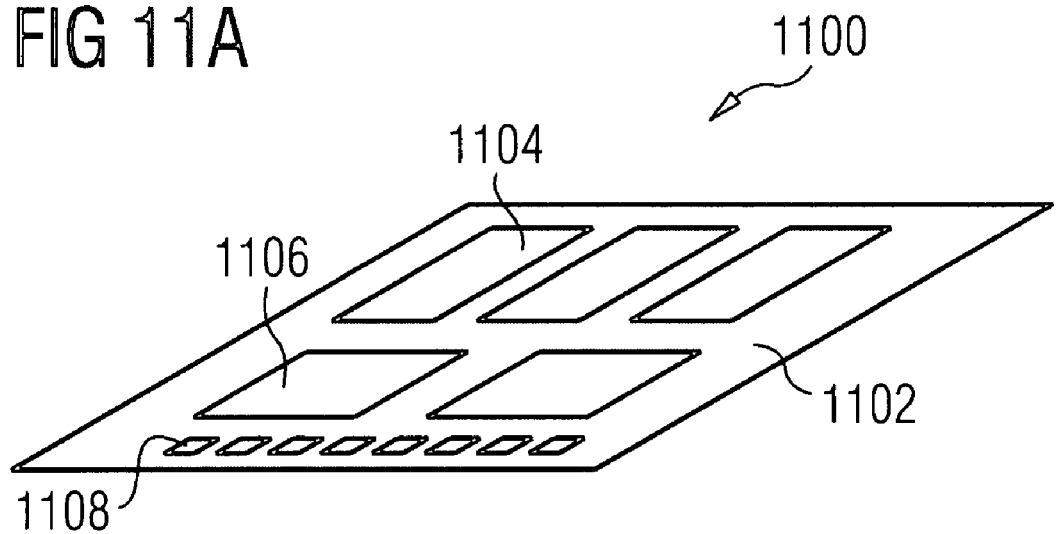
FIG. 11a shows a schematic perspective view of a memory module according to one embodiment of the present invention.
Figure 11B:
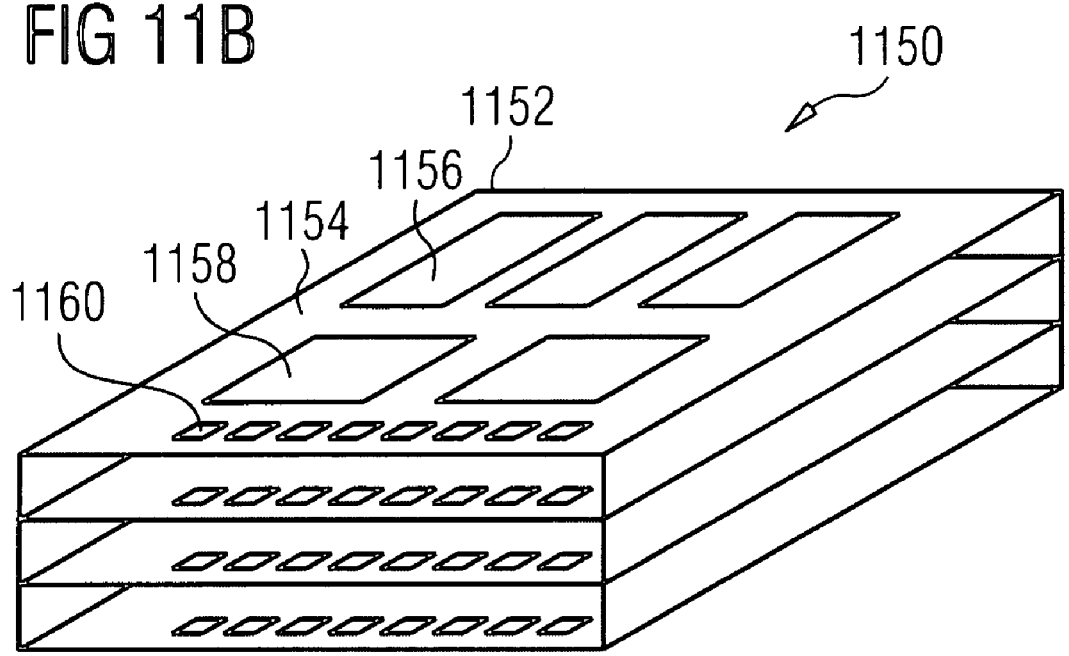
FIG. 11b shows a schematic perspective view of a memory module according to one embodiment of the present invention.

As shown in FIGS. 11a and 11b, in some embodiments, memory devices such as those described herein may be used in modules. In F 11a, a memory module 1100 is shown, on which one or more memory devices/integrated circuits 1104 are arranged on a substrate 1102. The memory device/integrated circuit 1104 may include numerous memory cells. The memory module 1100 may also include one or more electronic devices 1106, which may include memory, processing circuitry, control circuitry, addressing circuitry, bus interconnection circuitry, or other circuitry or electronic devices that may be combined on a module with a memory device, such as the memory device/integrated circuit 1104. Additionally, the memory module 1100 includes multiple electrical connections 1108, which may be used to connect the memory module 1100 to other electronic components, including other modules.

As shown in FIG. 11b, in some embodiments, these modules may be stackable, to form a stack 1150. For example, a stackable memory module 1152 may contain one or more memory devices 1156, arranged on a stackable substrate 1154. The memory device 1156 contains memory cells that employ memory elements in accordance with an embodiment of the invention. The stackable memory module 1152 may also include one or more electronic devices 1158, which may include memory, processing circuitry, control circuitry, addressing circuitry, bus interconnection circuitry, or other circuitry or electronic devices that may be combined on a module with a memory device, such as the memory device 1156. Electrical connections 1160 are used to connect the stackable memory module 1152 with other modules in the stack 1150, or with other electronic devices. Other modules in the stack 1150 may include additional stackable memory modules, similar to the stackable memory module 1152 described above, or other types of stackable modules, such as stackable processing modules, control modules, communication modules, or other modules containing electronic components.

In the following description, further aspects of exemplary embodiments of the present invention will be explained.

Select devices with common counterelectrode are used to select the resistive memory cells, for example within a 1T1R $8F^2$ design. According to one embodiment of the present invention, one transistor is used for four cells and a $2F^2$ design can be realized.

It is possible to select a memory cell of a memory device using a cross-point structure for top and bottom electrode with one line per column and one line per row or one select device per memory cell. Both approaches have a higher area per cell than the embodiments of the memory device according to the present invention discussed above.

According to one embodiment of the present invention, the cell density is increased using a common select device for half selecting of a group of cell (four cells in the embodiment described below) and one bit line per half selected cell. In highly symmetric patterns (e.g., rectangular, hexagonal . . . ) this means two bit lines per cell row or column are necessary to enable full select. The principle of using a single select device for a group of cells increases the cell density. In "classical" X-point designs one bit line, one word line and one select device per cell are used.

According to one embodiment of the present invention, the memory cell density is increased by using a common select transistor for half selecting a group of cells. Full select of a single cell is achieved by using one bitline per half selected cell. For the rectangular structure of memory cells around the transistor in this embodiment, this leads to four bit lines per transistor area, in other words two bit lines per cell row/column. The bit lines contact every second cell in shifting order. In FIGS. 2 to 5, this is worked out for four cells per select device. Proposed is a "face centered cubic"-like structure. The principle can be extended to, e.g., hexagonal structures. The design is worked out for four cells per select device and two bit lines per cell row.

According to one embodiment of the present invention, one select device is not used for one, but for a group of memory cells.

According to one embodiment of the present invention, one address line per cell is used in a memory cell group, i.e., two address lines per bit row (in total four address lines per group of four memory cells, for example).

One advantage of this embodiment is that memory cells of $2F^2$ or less can be realized for resistive memory cells.

In the context of this description chalcogenide material (ion conductor) is to be understood, for example, as any compound containing sulphur, selenium, germanium and/or tellurium. In accordance with one embodiment of the invention, the ion conducting material is, for example, a compound, which is made of a chalcogenide and at least one metal of the group I or group II of the periodic system, for example arsene-trisulfide-silver. Alternatively, the chalcogenide material contains germanium-sulfide (GeS), germanium-selenide (GeSe), tungsten oxide ($WO_x$), copper sulfide (CuS) or the like. The ion conducting material may be a solid state electrolyte.

Furthermore, the ion conducting material can be made of a chalcogenide material containing metal ions, wherein the metal ions can be made of a metal, which is selected from a group consisting of silver, copper and zinc or of a combination or an alloy of these metals.

As used herein the terms "connected" and "coupled" are intended to include both direct and indirect connection and coupling, respectively.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. An integrated circuit comprising a plurality of memory cells, each memory cell comprising:
   a first electrode;
   a second electrode; and
   an active material arranged between the first electrode and the second electrode,
   the memory cells being grouped into memory cell groups, each memory cell group defining a memory cell group area and being configured such that, corresponding first electrodes are individually addressable, and corresponding second electrodes are commonly addressable via a common select device arranged within the memory cell group area of the memory cell group, wherein the first electrodes are addressable via address lines, and electrical connections connect each first electrode of a memory cell group to an individual address line, the address lines further comprising first address lines and second address lines, the first address lines alternating with the second address lines, wherein the electrical connections connected to the first address lines extend in opposite direction compared to the electrical connections connected to the second address lines.

2. The integrated circuit according to claim 1, wherein each memory cell group is configured such that corresponding memory cells comprise only one common second electrode.

3. The integrated circuit according to claim 2, wherein each memory cell group is configured such that corresponding first electrodes are arranged around a common second electrode.

4. The integrated circuit according to claim 1, wherein each memory cell group is configured such that corresponding first electrodes are arranged around a common second electrode in a point-symmetrical manner.

5. The integrated circuit according to claim 4, wherein the arrangement of first electrodes around a common second electrode comprises an arrangement having a rectangular shape or a hexagonal shape or an octagonal shape, the symmetry center of each shape being the respective common second electrode.

6. The integrated circuit according to claim 1, wherein the memory cells form a memory cell array comprising memory cell rows and memory cell columns, the address lines being arranged parallel to the memory cell rows.

7. The integrated circuit according to claim 6, wherein each address line is electrically connected to every second memory cell of a memory cell row.

8. The integrated circuit according to claim 6, wherein lateral positions of the first electrodes differ from lateral positions of the address lines to which the first electrodes are electrically connected.

9. The integrated circuit according to claim 8, wherein the electrical connections extend in a direction parallel to the memory cell rows from the address lines to the first electrodes.

10. The integrated circuit according to claim 1, wherein all memory cell groups form the same memory cell pattern or of first and second electrodes pattern.

11. The integrated circuit according to claim 1, wherein the memory cells have a vertical architecture.

12. The integrated circuit according to claim 1, wherein the memory cells have a lateral architecture.

13. The integrated circuit according to claim 1, wherein each memory cell group comprises four memory cells.

14. The integrated circuit according to claim 1, wherein the memory device comprises a non volatile memory device.

15. The integrated circuit according to claim 14, wherein the memory device comprises a solid electrolyte random access memory device, the active material being solid electrolyte material.

16. The integrated circuit according to claim 14, wherein the memory device comprises a phase changing random access memory device, the active material being phase changing material.

17. The integrated circuit according to claim 1, wherein the first electrodes are top electrodes, and the second electrodes are bottom electrodes.

18. The integrated circuit according to claim 1, wherein the address lines are bit lines.

19. The integrated circuit according to claim 1, wherein the address lines are at least partially stacked above each other.

20. A memory module comprising at least one memory device comprising a plurality of memory cells, each memory cell comprising: a first electrode; a second electrode; and an active material arranged between the first electrode and the second electrode, wherein the memory cells are grouped into memory cell groups, each memory cell group defining a memory cell group area and being configured such that corresponding first electrodes are individually addressable, and corresponding second electrodes are commonly addressable via a common select device arranged within the memory cell group area of the memory cell group, wherein the first electrodes are addressable via address lines, and electrical connections connect each first electrode of a memory cell group to an individual address line, the address lines further comprising first address lines and second address lines, the first address lines alternating with the second address lines, wherein the electrical connections connected to the first address lines extend in opposite direction compared to the electrical connections connected to the second address lines.

21. The memory module according to claim 20, wherein the memory module is stackable.

* * * * *